United States Patent
Cheng

(10) Patent No.: US 10,714,193 B2
(45) Date of Patent: Jul. 14, 2020

(54) DATA STORAGE APPARATUS AND METHOD FOR PREVENTING DATA ERROR USING THE SAME

(71) Applicant: Silicon Motion, Inc., Zhubei, Hsinchu County (TW)

(72) Inventor: Yu-Hsuan Cheng, New Taipei (TW)

(73) Assignee: SILICON MOTION, INC., Zhubei, Hsinchu County (TW)

(*) Notice: Subject to any disclaimer, the term of this patent is extended or adjusted under 35 U.S.C. 154(b) by 0 days.

(21) Appl. No.: 16/388,445

(22) Filed: Apr. 18, 2019

(65) Prior Publication Data
US 2019/0325981 A1 Oct. 24, 2019

(30) Foreign Application Priority Data

Apr. 19, 2018 (TW) .............................. 107113372 A

(51) Int. Cl.
*G11C 29/42* (2006.01)
*G11C 16/34* (2006.01)
*G06F 3/06* (2006.01)
*G06F 11/07* (2006.01)

(52) U.S. Cl.
CPC .......... *G11C 16/3418* (2013.01); *G06F 3/064* (2013.01); *G06F 3/0614* (2013.01); *G06F 3/0619* (2013.01); *G06F 11/076* (2013.01); *G06F 11/0751* (2013.01); *G11C 16/3422* (2013.01); *G11C 29/42* (2013.01); *G06F 2212/1032* (2013.01)

(58) Field of Classification Search
CPC ............ G11C 16/3418; G11C 16/3422; G06F 3/0614; G06F 11/0751; G06F 11/076; G06F 2212/1032
See application file for complete search history.

(56) References Cited

U.S. PATENT DOCUMENTS

| | | | |
|---|---|---|---|
| 7,818,525 B1* | 10/2010 | Frost .................. | G06F 12/0246 365/185.25 |
| 8,954,650 B2* | 2/2015 | Belgal ................. | G06F 12/0246 711/103 |
| 9,552,171 B2* | 1/2017 | Huang ................. | G06F 3/0647 |
| 10,115,472 B1* | 10/2018 | Camp ................. | G11C 16/3418 |
| 2016/0118132 A1* | 4/2016 | Prins .................. | G06F 12/0246 714/704 |
| 2018/0374551 A1* | 12/2018 | Hu ..................... | G11C 16/3431 |

\* cited by examiner

*Primary Examiner* — Vanthu T Nguyen
(74) *Attorney, Agent, or Firm* — Birch, Stewart, Kolasch & Birch, LLP

(57) ABSTRACT

A data storage apparatus and a method for preventing data error using the same are provided. The data storage apparatus includes a memory and a memory controller. The memory includes a plurality of blocks. The memory controller is coupled to the memory and configured to perform the following operations: recording a read count of a target block of the memory; performing an error bit check on a free storage space of the target block when the read count of the target block meets a condition; and programming a dummy data to the free storage space of the target block in response to the determination that the check result is negative.

12 Claims, 3 Drawing Sheets

DATA STORAGE APPARATUS AND METHOD FOR PREVENTING DATA ERROR USING THE SAME

This application claims the benefit of Taiwan application Serial No. 107113372, filed Apr. 19, 2018, the subject matter of which is incorporated herein by reference.

BACKGROUND OF THE INVENTION

Field of the Invention

The invention relates in general to a data storage apparatus and a method using the same.

Description of the Related Art

Along with the advance in the fabrication of memory, the internal structure of the memory is arranged even more compact to achieve a large storage capacity per unit. However, such compact arrangement makes the influence of read disturbance become more serious. Read disturbance refers to the unexpected influence caused to a non-read position of the memory in a read operation. For example, the valve voltage distribution of the memory cell at the non-read position is offset. If the valve voltage distribution is already offset before data is written to the memory cell, then the memory cell will have uncorrectable error bits after data is written to it.

SUMMARY OF THE INVENTION

The present invention discloses a data storage apparatus and a method using the same capable of detecting which blocks of the memory are affected by read disturbance to avoid effective data being written to the detected blocks.

According to one embodiment of the present invention, a data storage apparatus including a memory and a memory controller is provided. The memory includes a plurality of blocks. The memory controller is coupled to the memory and configured to perform the following operations: recording a read count of a target block of the memory; performing an error bit check on a free storage space of the target block when the read count of the target block meets a condition; and programming a dummy data to the free storage space of the target block in response to the determination that the check result is negative.

According to another embodiment of the present invention, a method for preventing data error using a data storage apparatus is provided. The data storage apparatus includes a memory and a memory controller. The method for preventing data error is performed by a memory controller and includes the following steps: recording a read count of a target block of the memory; performing an error bit check on a free storage space of the target block when the read count of the target block meets a condition; and programming a dummy data to the free storage space of the target block in response to the determination that the check result is negative.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
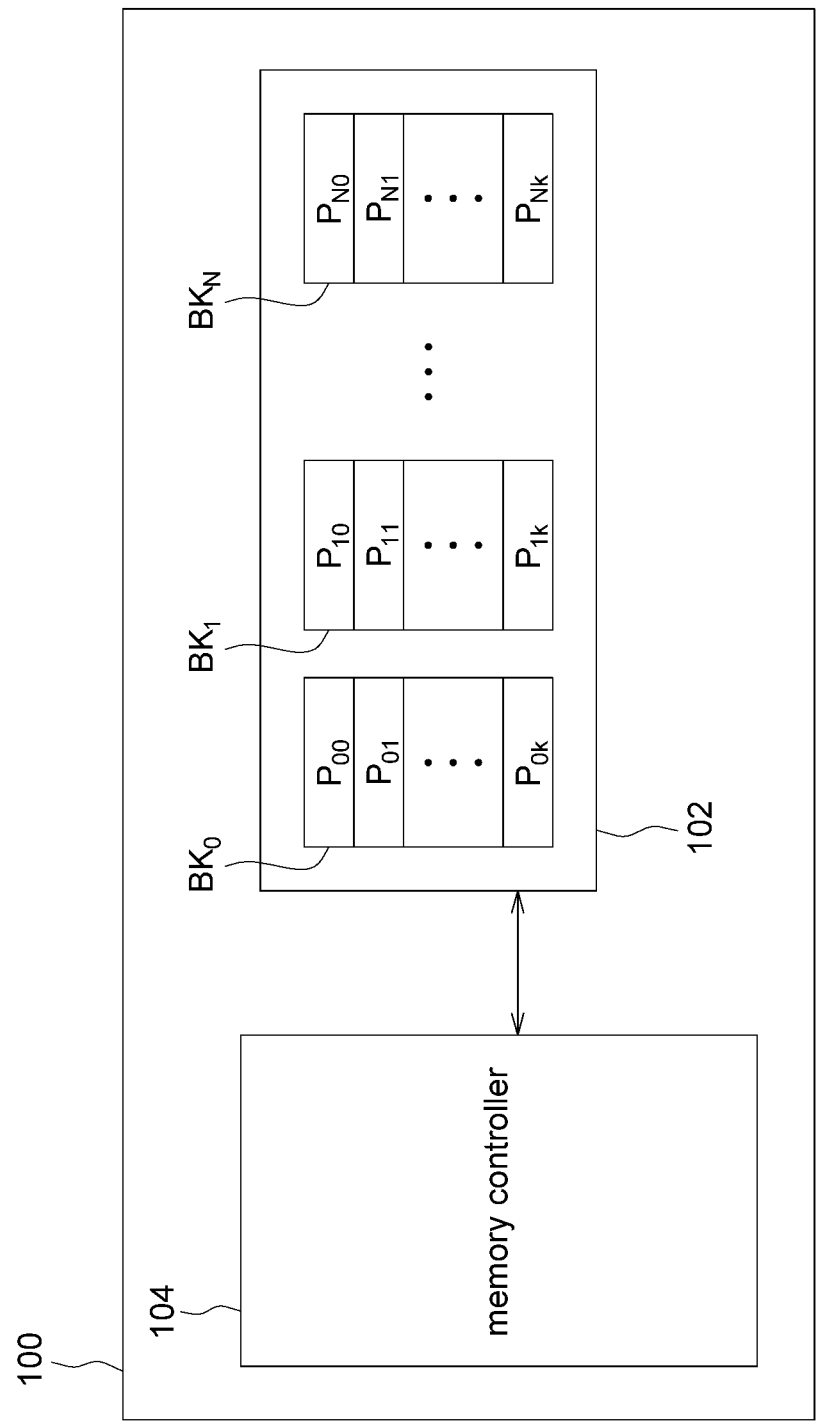
FIG. 1 is a block diagram of a data storage apparatus according to an embodiment of the present disclosure.

FIG. 1 is a block diagram of a data storage apparatus 100 according to an embodiment of the present disclosure. The data storage apparatus 100 includes a memory 102 and the memory controller 104. The memory controller 104 is coupled to the memory 102 and configured to perform the data storage apparatus according to an embodiment of the present disclosure.

The memory 102 can be realized by a non-volatile memory, such as a NAND flash memory. The memory controller 104 can be realized by one or more than one controller chip, and can transmit data and instruction to the memory 140 or receive data and instruction from the memory 140 to perform operation, such as reading, programming, and erasing, to the memory 102. For example, the memory controller 104 may include a micro-controller with firmware code and a read only memory (ROM), wherein the micro-controller can execute the firmware code to operate or access the memory 104.

The memory 102 includes a plurality of logic unit numbers (LUN), each including at least one logic unit plane. Each plane includes a plurality of blocks, such as block $BK_0 \sim BK_N$, each including a plurality of pages. Each page includes at least one sector. The memory controller 104 may access the user data of a particular page or block of the memory 102 according to a physical address. As indicated in FIG. 1, the block $BK_0$ includes pages $P_{00} \sim P_{0K}$, the block $BK_1$ includes pages $P_{10} \sim P_{1K}$, ..., the block $BK_N$ includes pages $P_{N0} \sim P_{NK}$. Each page may include a number of memory cells (not illustrated). Based on the types of the memory, the memory cells can be programmed as quad level cells (QLC), triple level cells (TLC), multiple level cells (MLC) or single level cells (SLC).

The data storage apparatus 100 can further be coupled to a host (not illustrated). The host can output a data access instruction (read or write) to the data storage apparatus 100 to access the user data of the data storage apparatus 100 (read or write the user data). For example, the memory controller 104 of the data storage apparatus 100, in response to a data read instruction received from the host, can read one or more than one specific physical address of the memory 102. The host can be realized by a personal computer, a mobile phone, a PC tablet, a car system, or a navigation device.

It should be noted that for the simplification of description, FIG. 1 only illustrates elements relevant to the present disclosure. However, the implementation of the present disclosure is not limited to the architecture of FIG. 1.

Figure 2:
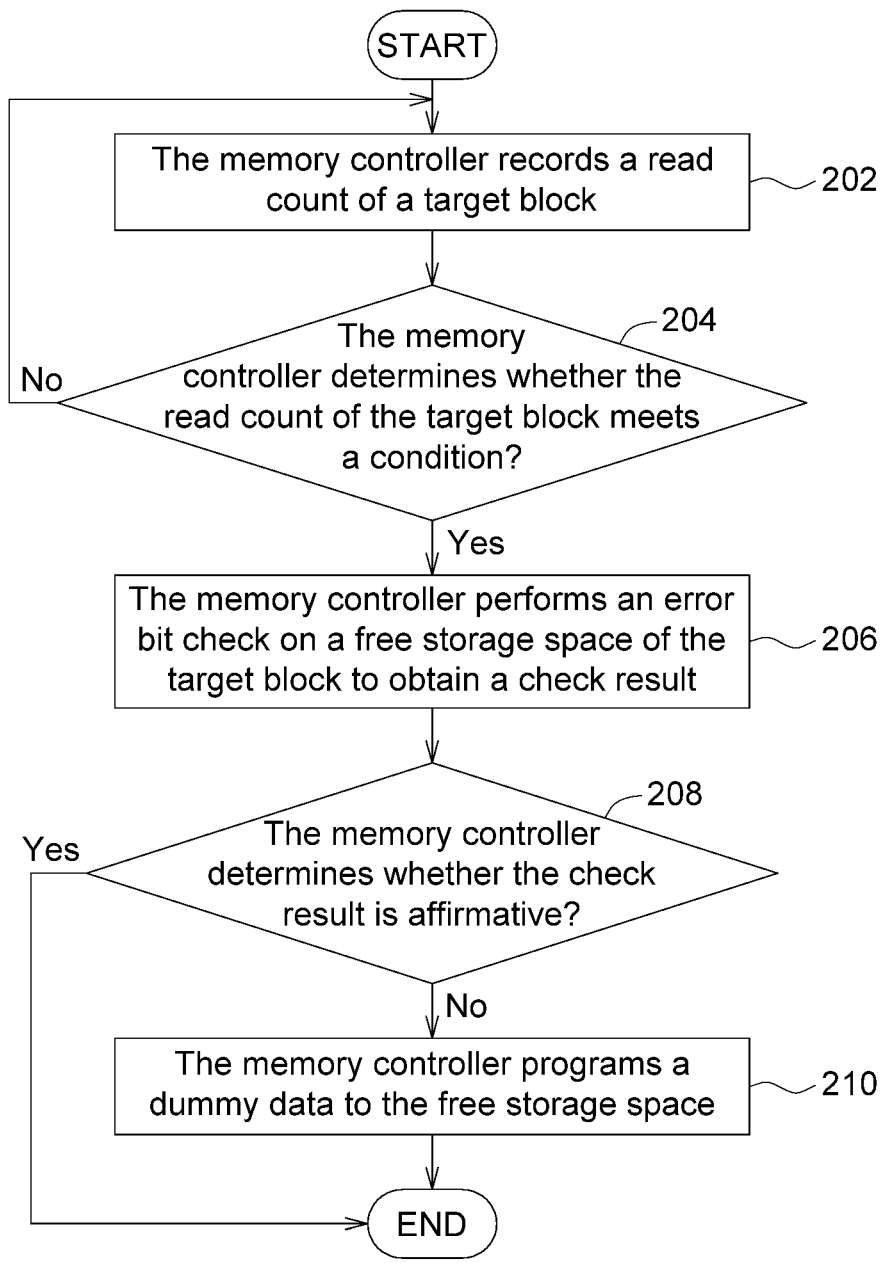
FIG. 2 is a flowchart of a method for preventing data error using a data storage apparatus according to an embodiment of the present disclosure.

FIG. 2 a flowchart of a method for preventing data error using a data storage apparatus 100 according to an embodiment of the present disclosure.

In step 202, the memory controller 104 records a read count of a target block (such as block $BK_0$). The read count is calculated according to the read count of the page (such as page $P_{00}$) or sector (such as the sector of the page $P_{00}$) of the target block. Preferably, the read count of the target block is the sum of the read count of respective page or sector or the maximum read count of pages or sectors. Additionally, the target block preferably is the block to which the user data received from the host is written or the block (or referred as a destination block) to which the user data received from another block (or referred as a source block) is written. The target block preferably is the block without the end of block (EOB) information, and is also referred as an open block, which still has a free storage space. The free storage space includes one or more than one page or sector not programmed with the user data. The EOB information includes the physical to logic mapping information of the user data.

In step 204, the memory controller 104 determines whether the read count of the target block meets a condition. Examples of the condition includes whether the target block has a read count over a threshold value. The threshold value can be a fixed value, such as 20000; or, the threshold value decreases as the erase count of the target block increases. For example, when the erase count is less than 200, the threshold value is 20000; when the erase count is greater than 200, the limit is 18000.

In step 206, when the condition is met, the memory controller 104 performs an error bit check on a free storage space of the target block to obtain a check result. The target of the error bit check is any page or sector of the free storage space. In the error bit check, the target is read and whether a read result includes a non-default value is determined. For example, if "1" is the default value that the read result should display, then "0" is the non-default value. The memory controller 104 reads any page or sector of the free storage space and determines whether the read result includes "0". If the result shows no, then the check result is affirmative. If the result shows yes, then the check result is negative. Besides, the memory controller 104 can output the read result to an error correcting code (ECC) engine, which will output the number of error bits, then the memory controller 104 determines whether the check result is affirmative or not according to the number of error bits. If the number of error bits is 0, then the check result is affirmative. If the number of error bits is greater than 0, then the check result is negative. Moreover, considering the error correcting function of the ECC engine, even when the read result includes multiple error bits, the memory controller 104 still can determine that the check result is affirmative. For example, if the count of "0" in the read result is less than 50, then the check result is affirmative; and only if the count of "0" in the read result is greater than or equivalent to 50 will the check result be determined as failure.

In step 208, the memory controller 104 determines whether the check result is affirmative. If yes, the method for preventing data error terminates; if no, the method proceeds to step 210.

In step 210, the memory controller 104 programs a dummy data to the free storage space. If the memory controller 104 determines that the check result is negative in step 208, then no more user data is written to the free storage space of the target block; otherwise the dummy data is programmed to the free storage space. Then, the EOB information is written to the default address, such as the last page. Then, the target block is closed or changed to a data block.

In an embodiment, in step 210, the memory controller 104 can choose to program a dummy data to only a part of the free storage space of the target block. For example, the dummy data is written to only the one or more than one free page with write disturbance, wherein, write disturbance occurs when user data is written to the target page. The write disturbance occurs in the word lines physically adjacent or stringed to the word line of the target page.

The bit value of all bits in the free storage space of the target block should be "1". If the bit value changes to "0", this change could be caused by read disturbance. The method for preventing data error detects whether the free storage space is affected by read disturbance. If the check result is negative, this means that read disturbance may affect write correctness. Therefore, the data storage apparatus should avoid writing user data to the target block. Or, as indicated in step 210, a dummy data is programmed to the free storage space of the target block.

In an embodiment, the method for preventing data error is preferably performed in the background, such that system efficiency of the host of the data storage apparatus 100 will not be affected. Besides, the target of the error bit check can be the first page or sector or the last page or sector of the free storage space.

Figure 3:
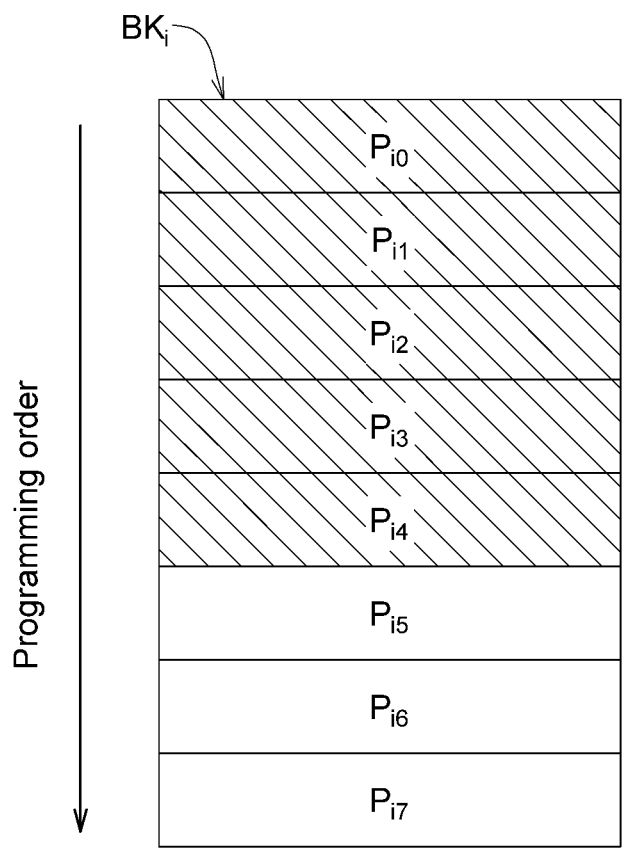
FIG. 3 is a schematic of data programming according to an embodiment of the present disclosure.

FIG. 3 is a schematic of data programming according to an embodiment of the present disclosure. In the example of FIG. 3, the target block includes pages $P_0$~$P_7$ (to be more precisely, logic pages $P_0$~$P_7$), and the user data is sequentially programmed to pages $P_0$~$P_7$ in the order of pages. The shaded pages $P_0$~$P_4$ are pages programmed with user data. The unshaded pages $P_5$~$P_7$ are pages not programmed with user data, that is, the free storage space of the target block. In the multiple level cell, pages $P_0$ and $P_2$ can be controlled by the same word line, and pages $P_1$~$P_3$ can be controlled by another word line. In the triple level cell, pages $P_0$, $P_2$ and $P_5$ can be controlled by the same word line. The rest can be obtained by the same analogy.

Unless the order of operations of the method disclosed in the embodiments of the present disclosure is specified, otherwise the order of operations of the method can be adjusted, and some or even all of the operations can be performed concurrently.

According to the embodiments of the present disclosure, an accumulative read count of the memory is detected; the error correcting code check can be performed on the target block of the memory when the read count meets a specific condition, such that the target block affected by read disturbance can be obtained; and a dummy data is programmed to the affected target block to avoid effective user data being programmed to the affected target block again. Thus, the reliability of data storage can be effectively increased, and uncorrectable error bits can be reduced.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A data storage apparatus, comprising:
a memory, comprising a plurality of blocks; and
a memory controller coupled to the memory and configured to perform the following operations:
recording a read count of a target block of the memory;
performing an error bit check on a free storage space of the target block when the read count of the target block meets a condition; and
programming a dummy data to the free storage space of the target block in response to the determination that the check result is negative.

2. The data storage apparatus according to claim 1, wherein the target block comprises a plurality of pages or a plurality of sectors, and the read count of the target block indicates the sum of the read count of respective page or sector of the target block.

3. The data storage apparatus according to claim 1, wherein when determining whether the read count of the target block meets the condition, the determination is based on whether the read count of the target block is over a threshold value.

4. The data storage apparatus according to claim 1, wherein when performing the error bit check, the memory controller reads a page or sector of the free storage space and determines whether a read result comprises a default value.

5. The data storage apparatus according to claim 1, wherein when performing the error bit check, the memory controller reads a page or sector of the free storage space, transmits a read result to an error correcting code engine, and determines the check result according to the number of error bit outputted from the error correcting code engine.

6. The data storage apparatus according to claim 1, wherein when programming the dummy data to the free storage space of the target block, the memory controller programs the dummy data to a part of the free storage space of the target block.

7. A method for preventing data error using a data storage apparatus, wherein the data storage apparatus comprises a memory and a memory controller, and the method for preventing data error is performed by a memory controller and comprises:
   recording a read count of a target block of the memory;
   performing an error bit check on a free storage space of the target block when the read count of the target block meets a condition; and
   programming a dummy data to the free storage space of the target block in response to the determination that the check result is negative.

8. The method for preventing data error according to claim 7, wherein the target block comprises a plurality of pages or a plurality of sectors, and the read count of the target block indicates the sum of the read count of respective page or sector of the target block.

9. The method for preventing data error according to claim 7, wherein when determining whether the read count of the target block meets the condition, the determination is based on whether the read count of the target block is over a threshold value.

10. The method for preventing data error according to claim 7, wherein when performing the error bit check, the memory controller reads a page or sector of the free storage space and further determines whether a read result comprises a non-default value.

11. The method for preventing data error according to claim 7, wherein when performing the error bit check, the memory controller reads a page or sector of the free storage space, transmits a read result to an error correcting code engine, and determines the check result according to the number of error bit outputted from the error correcting code engine.

12. The method for preventing data error according to claim 7, wherein when programming the dummy data to the free storage space of the target block, the memory controller programs the dummy data to a part of the free storage space of the target block.

* * * * *